(12) United States Patent
Shiu et al.

(10) Patent No.: US 8,686,297 B2
(45) Date of Patent: Apr. 1, 2014

(54) LAMINATED FLEX CIRCUIT LAYERS FOR ELECTRONIC DEVICE COMPONENTS

(75) Inventors: Boon W. Shiu, San Jose, CA (US); Yi Jiang, Sunnyvale, CA (US); Chun-Lung Chen, Sunnyvale, CA (US); Robert W. Schlub, Cupertino, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 172 days.

(21) Appl. No.: 13/220,230

(22) Filed: Aug. 29, 2011

(65) Prior Publication Data
US 2013/0048347 A1 Feb. 28, 2013

(51) Int. Cl.
*H05K 1/02* (2006.01)

(52) U.S. Cl.
USPC ............ 174/254; 174/250; 174/257; 174/260

(58) Field of Classification Search
USPC ................... 174/250, 254, 257, 260; 343/702
See application file for complete search history.

(56) References Cited

U.S. PATENT DOCUMENTS

| 5,046,238 | A  | * | 9/1991  | Daigle et al. ............. 29/830 |
| 5,437,091 | A  |   | 8/1995  | Norman |
| 2004/0246180 | A1 |   | 12/2004 | Okado |
| 2005/0190531 | A1 | * | 9/2005  | Gall et al. ............. 361/600 |
| 2007/0218269 | A1 | * | 9/2007  | Kato et al. ............. 428/304.4 |
| 2008/0110020 | A1 | * | 5/2008  | Heisen et al. ............. 29/847 |
| 2009/0295646 | A1 |   | 12/2009 | Oh et al. |
| 2010/0060529 | A1 |   | 3/2010  | Schlub et al. |
| 2010/0177011 | A1 |   | 7/2010  | Sego et al. |
| 2011/0012793 | A1 | * | 1/2011  | Amm et al. ............. 343/702 |

FOREIGN PATENT DOCUMENTS

| EP | 2259213 A2 | 12/2010 |
| JP | 2006-078422 A | 3/2006 |
| WO | 2005/027264 A1 | 3/2005 |
| WO | 2006121478 A2 | 11/2006 |
| WO | 2007011377 A2 | 1/2007 |

OTHER PUBLICATIONS

PCT Search Report; Application No. PCT/US2012/050388 dated Feb. 28, 2013.
PCT Written Opinion; Application No. PCT/US2012/050388 dated Feb. 28, 2013.

* cited by examiner

*Primary Examiner* — Hoa C Nguyen
*Assistant Examiner* — Paresh Paghadal
(74) *Attorney, Agent, or Firm* — Womble Carlyle Sandridge & Rice, LLP

(57) ABSTRACT

An electronic device may have a housing in which an antenna and a proximity sensor formed from flex circuit structures are mounted. The flex circuit structures may include first and second flex circuit layers. The first and second flex circuit layers may include metal antenna structures and metal proximity sensor electrode structures. Solder may be used to attach electrical components to the flex circuit layers and may be used to electrically connect metal structures on the first and second flex circuit layers to each other. The first and second flex circuit layers may be laminated together using a compressive fixture. The compressive fixture may have a first fixture with a convex surface and a second fixture with a concave surface so that the laminated flex circuit layers are provided with a bend.

20 Claims, 14 Drawing Sheets

LAMINATED FLEX CIRCUIT LAYERS FOR ELECTRONIC DEVICE COMPONENTS

BACKGROUND

This relates generally to electronic devices, and, more particularly, to flexible structures in electronic devices.

Electronic devices such as portable computers and handheld electronic devices are becoming increasingly popular. Devices such as these are often provided with wireless communications capabilities. For example, electronic devices may use long-range wireless communications circuitry to communicate using cellular telephone bands. Electronic devices may use short-range wireless communications links to handle communications with nearby equipment. Electronic devices are also often provided with sensors and other electronic components.

It can be difficult to incorporate antennas, sensors, and other electrical components successfully into an electronic device. Some electronic devices are manufactured with small form factors, so space for components is limited. In many electronic devices, the presence of conductive structures can influence the performance of electronic components, further restricting potential mounting arrangements for components.

It would therefore be desirable to be able to provide improved ways in which to incorporate components in electronic devices.

SUMMARY

An electronic device may have integral antenna resonating element and proximity sensor capacitor electrode structures formed from conductive structures such as conductive flexible printed circuit ("flex circuit") structures.

The flex circuit structures may include first and second flex circuit layers. The first and second flex circuit layers may include metal antenna structures and metal proximity sensor electrode structures. Solder may be used to attach electrical components such as surface mount technology (SMT) components to the flex circuit layers. Solder may also be used to electrically connect metal structures on the first and second flex circuit layers to each other. The solder may be formed from a patterned solder paste or from solder ball structures that are held in place with solder resin before solder joint formation.

The first and second flex circuit layers may be laminated together using a compressive fixture. The compressive fixture may have a first fixture with a convex surface and a second fixture with a corresponding concave surface. The first fixture may be formed from a rigid material. The second fixture may be formed from an elastomeric material. The flex circuit layers may be laminated together between the convex and concave surfaces using adhesive. The adhesive may be patterned to form air gaps. The air gaps may allow gas to escape during solder joint formation. The bent shape of the convex and concave surfaces may be used to form a bend in the laminated flex circuit layers.

Further features of the invention, its nature and various advantages will be more apparent from the accompanying drawings and the following detailed description of the preferred embodiments.

DETAILED DESCRIPTION

Electronic devices may be provided with antennas, sensors, and other electronic components. It may be desirable to form these components from flexible structures. For example, it may be desirable to form components for electronic devices from flexible printed circuit structures. Flexible printed circuits, which are sometimes referred to as flex circuits, may include patterned metal traces on flexible substrates such as layers of polyimide or other flexible polymer sheets. Flex circuits may be used in forming antennas, capacitive sensors, assemblies that include antenna and capacitive sensor structures, other electronic device components, or combinations of these structures.

Figure 1:
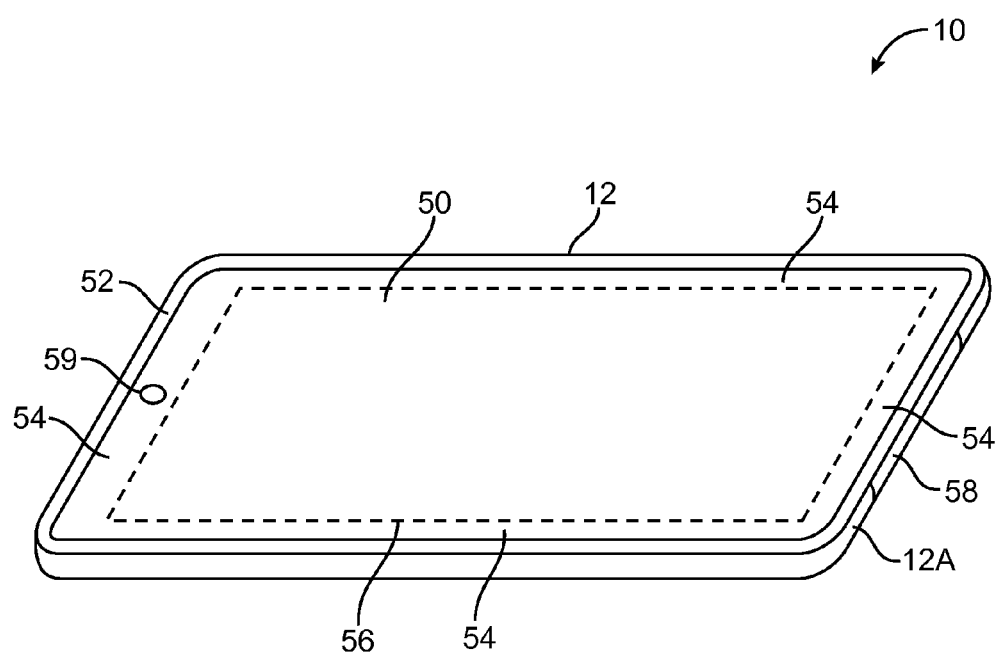
FIG. 1 is a front perspective view of an illustrative electronic device of the type that may be provided with component structures in accordance with an embodiment of the present invention.

An illustrative electronic device in which electronic components may be used is shown in FIG. 1. Portable device 10 may include one or more antenna resonating elements, one or more capacitive proximity sensor structures, one or more components that include antenna structures and proximity sensor structures, other electronic components, etc. Illustrative arrangements in which an electronic device such as device 10 of FIG. 1 is provided with electronic components such as antenna structures and/or proximity sensor structures that are formed from multiple flex circuit layers are sometimes described herein as an example. In general, electronic devices may be provided with any suitable flex-circuit-based electronic components. The electronic devices may be, for example, desktop computers, computers integrated into computer monitors, portable computers, tablet computers, handheld devices, cellular telephones, wristwatch devise, pendant devices, other small or miniature devices, televisions, set-top boxes, or other electronic equipment.

As shown in FIG. 1, device 10 may be a relatively thin device such as a tablet computer (as an example). Device 10 may have display such as display 50 mounted on its front (top) surface. Housing 12 may have curved portions that form the edges of device 10 and a relatively planar portion that forms the rear surface of device 10 (as an example). A radio-frequency (RF) window (sometimes referred to as an antenna window) such as RF window 58 may be formed in housing 12. Antenna and proximity sensor structures for device 10 may be formed in the vicinity of window 58.

Device 10 may have user input-output devices such as button 59. Display 50 may be a touch screen display that is used in gathering user touch input. The surface of display 50 may be covered using a dielectric member such as a planar cover glass member. The central portion of display (shown as region 56 in FIG. 1) may be an active region that displays images and that is sensitive to touch input. The peripheral regions of display 50 such as regions 54 may be inactive regions that are free from touch sensor electrodes and that do not display images.

A layer of material such as an opaque ink or plastic may be placed on the underside of display 50 in peripheral regions 54 (e.g., on the underside of the cover glass). This layer may be transparent to radio-frequency signals. The conductive touch sensor electrodes in region 56 may tend to block radio-frequency signals. However, radio-frequency signals may pass through the cover glass and opaque layer in inactive display regions 54 (as an example). In the opposite direction, radio-frequency signals may pass through antenna window 58. Lower-frequency electromagnetic fields also pass through window 58, so capacitance measurements for a proximity sensor may be made through antenna window 58.

Housing 12 may be formed from one or more structures. For example, housing 12 may include an internal frame and planar housing walls that are mounted to the frame. Housing 12 may also be formed from a unitary block of material such as a cast or machined block of aluminum. Arrangements that use both of these approaches may also be used if desired.

Housing 12 may be formed of any suitable materials including plastic, wood, glass, ceramics, metal, fiber-based composites such as carbon fiber composites, other suitable materials, or a combination of these materials. In some situations, portions of housing 12 may be formed from a dielectric or other low-conductivity material, so as not to disturb the operation of conductive antenna elements that are located in proximity to housing 12. In other situations, housing 12 may be formed from metal elements. An advantage of forming housing 12 from metal or other structurally sound conductive materials is that this may improve device aesthetics and may help improve durability and portability.

With one suitable arrangement, housing 12 may be formed from a metal such as aluminum. Portions of housing 12 in the vicinity of antenna window 58 may be used as antenna ground. Antenna window 58 may be formed from a dielectric material such as polycarbonate (PC), acrylonitrile butadiene styrene (ABS), a PC/ABS blend, or other plastics (as examples). Window 58 may be attached to housing 12 using adhesive, fasteners, or other suitable attachment mechanisms. To ensure that device 10 has an attractive appearance, it may be desirable to form window 58 so that the exterior surfaces of window 58 conform to the edge profile exhibited by housing 12 in other portions of device 10. For example, if housing 12 has straight edges 12A and a flat bottom surface, window 58 may be formed with a right-angle bend and vertical sidewalls. If housing 12 has curved edges 12A, window 58 may have a similarly curved surface.

Figure 2:
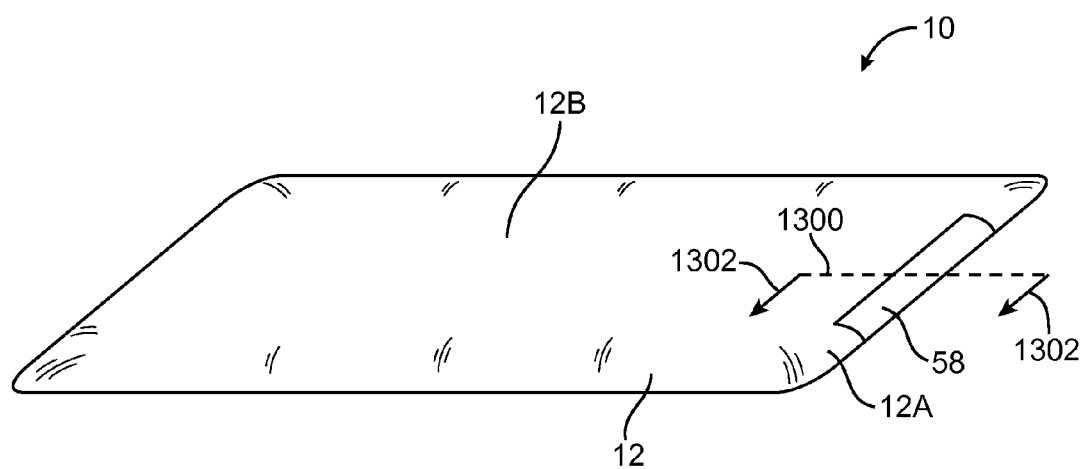
FIG. 2 is a rear perspective view of an illustrative electronic device such as the electronic device of FIG. 1 in accordance with an embodiment of the present invention.

FIG. 2 is a rear perspective view of device 10 of FIG. 1 showing how device 10 may have a relatively planar rear surface 12B and showing how antenna window 58 may be rectangular in shape with curved portions that match the shape of curved housing edges 12A.

Figure 3:
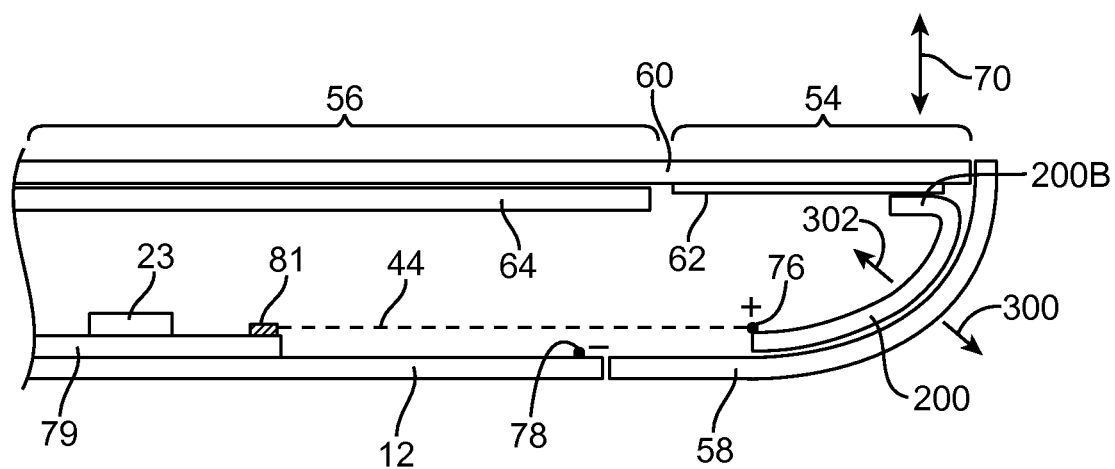
FIG. 3 is a cross-sectional side view of a portion of the electronic device of FIGS. 1 and 2 in accordance with an embodiment of the present invention.

A cross-sectional view of device 10 taken along line 1300 of FIG. 2 and viewed in direction 1302 is shown in FIG. 3. As shown in FIG. 3, structures 200 may be mounted within device 10 in the vicinity of RF window (antenna window) 58. Structures 200 may serve as an antenna resonating element for an antenna. The antenna may be fed using transmission line 44. Transmission line 44 may have a positive signal conductor that is coupled to positive antenna feed terminal 76 and a ground signal conductor that is coupled to antenna ground (e.g., housing 12 and other conductive structures) at ground antenna feed terminal 78.

The antenna resonating element formed from structures 200 may be based on any suitable antenna resonating element design (e.g., structures 200 may form a patch antenna resonating element, a single arm inverted-F antenna structure, a dual-arm inverted-F antenna structure, other suitable multi-arm or single arm inverted-F antenna structures, a closed and/or open slot antenna structure, a loop antenna structure, a monopole, a dipole, a planar inverted-F antenna structure, a hybrid of any two or more of these designs, etc.). Housing 12 may serve as antenna ground for an antenna formed from structure 200 or other conductive structures within device 10 may serve as ground (e.g., conductive components, traces on printed circuits, etc.).

Conductive structures 200 may form one or more proximity sensor capacitor electrodes. With one suitable arrangement, structures 200 may be formed from a flex circuit structure. The flex circuit structure may include at least first and second layers of patterned conductive material. The first and second layers of patterned conductive material may be formed on opposing sides of the flex circuit structure (e.g., top and bottom sides). At frequencies associated with antenna signals, the first and second layers may be effectively shorted to each other and may form an antenna resonating element. At lower frequencies, the first and second layers may serve as first and second proximity sensor capacitor electrodes (e.g., an inwardly directed electrode and an outwardly directed electrode).

Structures 200 may be implemented by laminating together two or more flex circuit layers to form a composite flex circuit structure. By incorporating multiple flex circuit layers into structures 200, potentially complex patterns of conductive traces (e.g., traces on three or more different metal layers) may be formed. Components may be mounted on the flex circuit layers and interconnected to the patterns of conductive traces. Lamination tools may be used in forming the composite flex circuit structure. The lamination tools may bend the flex circuit layers prior to lamination to help minimize built-in stress relative to flex circuit structures formed by bending a single layer of flex circuit material.

If desired, structures 200 may include integrated circuits, discrete components such as resistors, inductors, and capacitors, and other electronic devices. Structures 200 may also include conductive traces for forming antenna resonating element patterns, transmission lines, and proximity sensor electrode patterns (as examples).

Structures 200 may be formed from a first flex circuit layer and a second flex circuit layer. A first layer of patterned conductive material in structures 200 may be formed from one or more conductive trace layers in the first flex circuit layer. A second layer of patterned conductive material in structures 200 may be formed from one or more conductive trace layers in the second flex circuit layer. Conductive paths may be formed between the first and second layers using solder or other conductive materials (e.g., anisotropic conductive film, etc.).

The first layer of patterned conductive material may face outwards in direction 300 and the second patterned conductive layer may face inwards into housing 12 in direction 302 (as an example). The two layers of patterned conductive material may be electrically isolated from each other by interposed dielectric to form a parallel plate capacitor. At frequencies below about 1 MHz, the parallel plate capacitor may have a relatively high impedance (e.g., forming a DC open circuit), so that the patterned coating layers may serve as independent first and second proximity sensor capacitor electrodes. At frequencies above 1 MHz (e.g., at frequencies above 100 MHz or above 1 GHz), the impedance of the parallel plate capacitor is low, so the patterned conductive layers may be effectively shorted together. This allows both of the layers to operate together as a unitary patterned conductor in an antenna resonating element.

During operation of the antenna formed form structures 200, radio-frequency antenna signals can be conveyed through dielectric window 58. Radio-frequency antenna signals associated with structures 200 may also be conveyed through a display cover member such as cover glass 60. Display 50 may have an active region such as region 56 in which cover glass 60 has underlying conductive structure such as display panel module 64. The structures in display panel 64 such as touch sensor electrodes and active display pixel circuitry may be conductive and may therefore attenuate radio-frequency signals. In region 54, however, display 50 may be inactive (i.e., panel 64 may be absent). An opaque layer such as plastic or ink 62 may be formed on the underside of transparent cover glass 60 in region 54 to block the antenna resonating element from view. Opaque material 62 and the dielectric material of cover member 60 in region 54 may be sufficiently transparent to radio-frequency signals that radio-frequency signals can be conveyed through these structures in directions 70.

Figure 4:
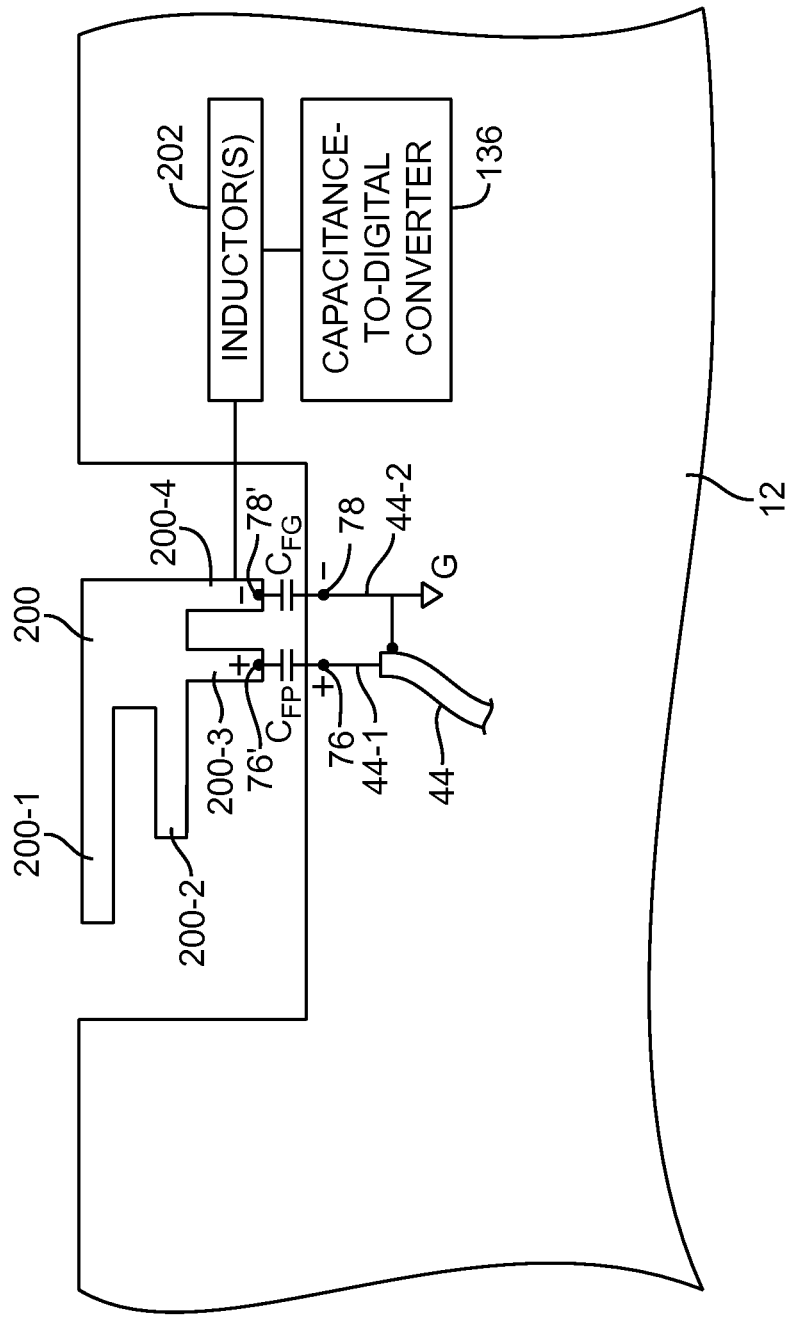
FIG. 4 is a top view of an illustrative integrated antenna and proximity sensor in an electronic device in accordance with an embodiment of the present invention.

FIG. 4 illustrates how structures 200 may be located in an opening in a portion of conductive housing structures 12 (as an example). Window 58 of FIG. 3 is not shown in FIG. 4. The opening in FIG. 4 has the shape of a rectangular recess along one edge of housing structures 12. Openings of other shapes may be used if desired. As shown in FIG. 4, the patterned conductive layers of structures 200 may have the shape of an inverted-F antenna resonating element. In particular, structures 200 may have a main branch such as branch 200-1, one or more additional branches such as branch 200-2 (e.g., to provide additional frequency resonances and/or broadened antenna bandwidth), a short circuit branch such as branch 200-4, and a feed branch such as branch 200-3. Other branches (arms), features such as bends, curved edges, and other shapes may be included if desired.

Transmission line 44 may be coupled between structures 200 and associated radio-frequency transceiver circuitry. Transmission line 44 may have a positive signal line that is connected to positive antenna feed terminal 76 and a ground signal line that is connected to ground antenna feed terminal 78. Positive antenna feed terminal 76 may be coupled to positive antenna feed terminal 76' on antenna resonating element branch 200-3 via capacitor Cfp. Ground antenna feed terminal 78 may be coupled to ground antenna feed terminal 78' on antenna resonating element branch 200-4 via capacitor Cfg.

The capacitance values for capacitors Cfp and Cfg are preferably of sufficient size to ensure that the impedance of these capacitors is low and does not disrupt antenna operation at frequencies associated with wireless signals in device 10. For example, if path 44 is being used to handle signals at frequencies of 100 MHz or more (e.g., cellular telephone signals, wireless local area network signals, etc.), the values of Cfp and Cfg may be 10 pF or more, 100 pF or more (e.g., 100s of pF), or may have other suitable sizes that ensure that transmitted and received antenna signals are not blocked. At lower frequencies, the impedance of capacitors Cfp and Cfg is preferably sufficiently large to prevent interference from reaching the antenna resonating element formed from structures 200.

Proximity sensor circuitry may be coupled to structures 200 through inductor(s) 202. For example, proximity sensor circuitry such as capacitance-to-digital converter circuitry 136 or other control circuitry may be used to make capacitance measurements using one or more capacitor electrodes formed from the patterned conductive layer(s) of structures 200. Inductor(s) 202 may have impedance values (e.g., impedances of 100s of nH) that prevent radio-frequency antenna signals (e.g., antenna signals at frequencies of 100 MHz or more) from reaching capacitance-to-digital converter 136 or other proximity sensor circuitry while allowing AC proximity sensor signals (e.g., signals with frequencies below 1 MHz) to pass between structures 200 and the proximity sensor circuitry.

Capacitors Cfp and Cfg form a high pass filter. By using high-pass circuitry such as capacitors Cfp and Cfg, low frequency noise can be prevented from interfering with antenna operation for structures 200. Inductor(s) 202 form a low-pass filter. By using low-pass circuitry such as inductor(s) 202, radio-frequency noise from antenna signals can be prevented from interfering with proximity sensor operation for structures 200. If desired, other types of high-pass and low-pass filters may be interposed between structures 200 and the radio-frequency transceiver circuitry and proximity sensor circuitry that is associated with structures 200. The arrangement of FIG. 4 is merely illustrative.

Figure 5:
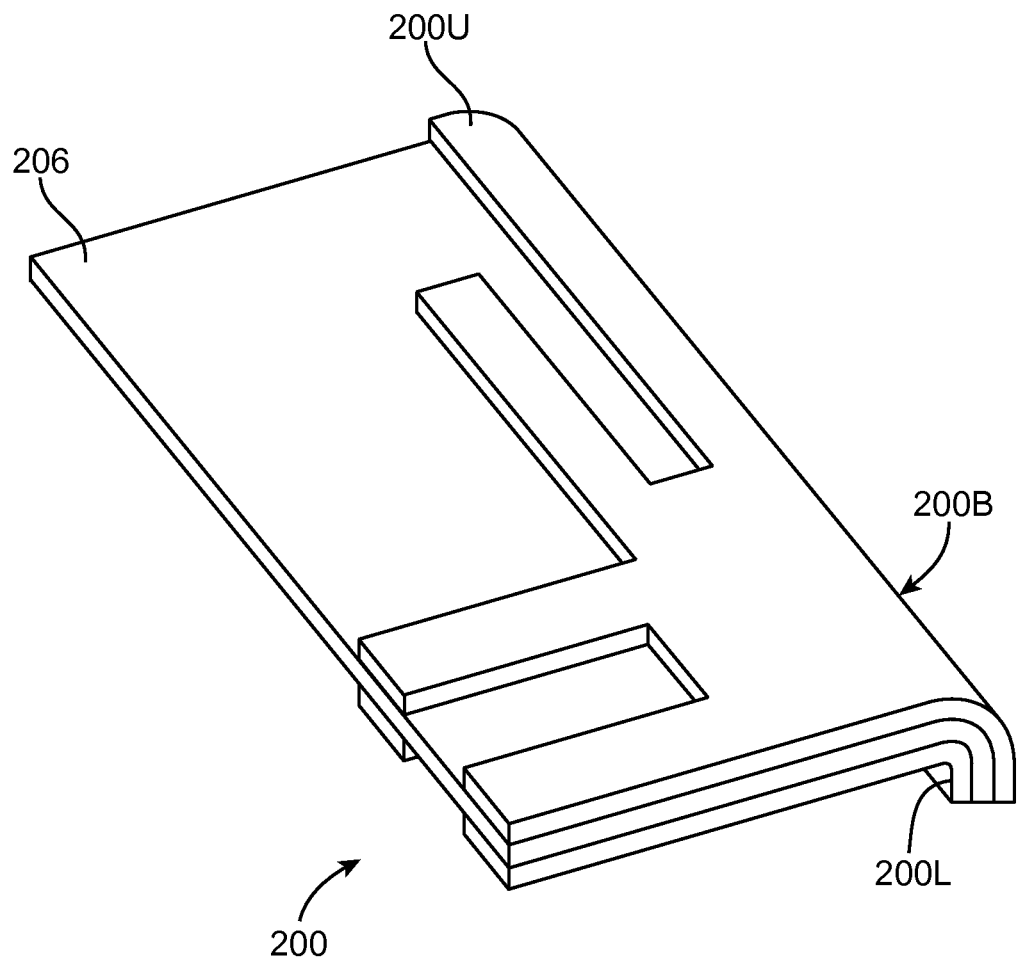
FIG. 5 is a perspective view of an electronic component formed from conductive traces on a flexible substrate with a bend to accommodate mounting within an electronic device in accordance with an embodiment of the present invention.

When assembled, conductive structures 200 may appear as shown in FIG. 5 (as an example). As shown in FIG. 5, conductive structures 200 may be bent. Conductive structures 200 may be formed from a composite flex circuit structure that includes at least first and second laminated flex circuits. The bend in the composite flex circuit structure of FIG. 5 may be formed by laminating the first and second flex circuits to each other while the first and second flex circuits are maintained in a bent configuration. Bending the flex circuits to a desired bend radius or to a tighter bend radius associated with over-bending before completing the lamination process may help reduce residual stress in the resulting composite flex circuit structure.

As shown in the FIG. 5 example, one of the edges of conductive structures 200 may be bent back along its length to form bent edge 200B. Bent edge 200B may allow structures 200 to fit within housing 12 so that bent edge 200B rests under inactive region 54 of display cover glass 60, as shown in FIG. 3. This is merely an illustrative configuration that may be used for mounting conductive structures 200 within housing 12 of device 10. Other configurations may be used if desired.

To help accommodate shapes for structures 200 that allow structures 200 to fit within housing 12 such as shapes with one or more bends, it may be desirable to form structures 200 using a lamination process. During the lamination process, two or more substrate layers such as two or more flex circuit layers may be attached to each other using adhesive.

Flex circuit layers for forming structures 200 may be formed from sheets of polyimide or other flexible polymer layers. Conductive patterned materials such as traces of metal may be used in forming antenna structures, component interconnects, transmission lines, sensor electrodes, and other conductive structures on the flex circuits. The flex circuits may contain one or more layers of metal traces with one or more layers of intervening dielectric (e.g., one or more intervening layers of polyimide or other flex circuit substrate materials).

During lamination, adhesive, heat, and/or pressure may be used in connecting multiple flex circuit layers together. Solder or other conductive materials (e.g., anisotropic conductive film, etc.) may be used in electrically connecting the metal traces on one flex circuit layer to another. Solder connections may be formed by reflowing solder paste structures in a reflow oven, by reflowing balls of solder in a reflow oven, by heating solder paste or solder balls using a localized heat source such as a heat bar (hot bar) or heat gun, or using other suitable solder reflow techniques.

Figure 6:
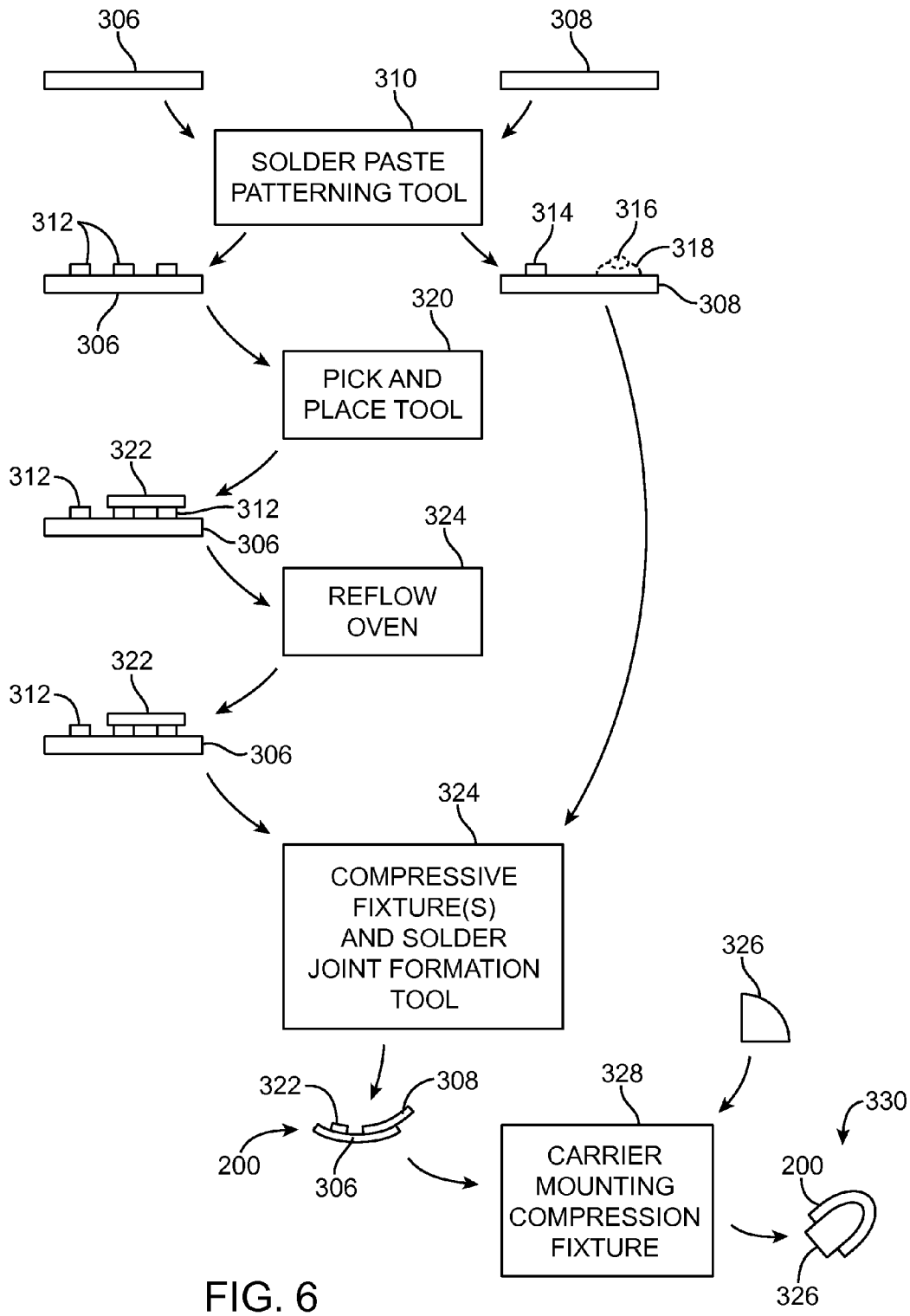
FIG. 6 is a diagram showing how components such as the component of FIG. 5 may be formed by combining multiple flexible layers in accordance with an embodiment of the present invention.

FIG. 6 is a diagram of equipment and processes involved in forming structures such as structures 200 of FIG. 5. Substrates such as substrates 306 and 308 may be used in forming structures 200. Substrates 306 and 308 may be, for example, flex circuit substrates formed from sheets of polyimide or other flexible polymers. Metal structures (e.g., one or more patterned layers of copper or other metals) may be formed on each flex circuit substrate.

Figure 12:
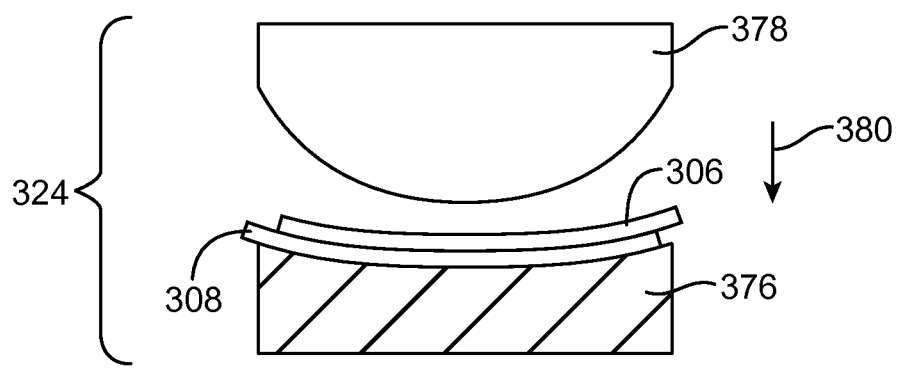
FIG. 12 is a cross-sectional side view of an illustrative tool for assembling flex circuit structures together just prior to compression of the flex circuit structures between upper and lower tool pieces in accordance with an embodiment of the present invention.

Solder paste may be deposited on the surfaces of substrates 306 and 308 using solder paste patterning tool 310. Tool 310 may include screen printing equipment or other equipment that can deposit a desired pattern of solder paste onto one or more surfaces of each flex circuit substrate. Patterned metal traces in substrates 306 and 308 may be used in forming solder pads. During solder paste deposition operations with tool 310, solder paste may be screen printed or otherwise deposited on top of the solder pads on substrates 306 and 308. In FIG. 12, solder paste patterns are shown as solder paste 312 on substrate 306 and solder paste 314 on substrate 308. If desired, solder for forming solder connections may be deposited on a flex circuit substrate in the form of one or more balls of solid solder. Solid solder balls may be temporarily held in place on a substrate using solder resin (see, e.g., solder ball 316 of FIG. 6, which is being held in place by resin 318).

If desired, integrated circuits, discrete components such as resistors, inductors, capacitors, switches, and other electrical components may be mounted on solder paste 312 and 314 (see, e.g., illustrative electrical component 322 on solder paste 312 on substrate 306 in the example of FIG. 6). These components may be, for example, surface mount technology (SMT) components that are attached to the flex circuit substrates using a pick and place tool (as an example).

Following placement of components 322 on substrate 306 using pick and place tool 320, a heat source such as reflow oven 324 may be used to reflow the solder on substrate 306. During the reflow process, the heat produced by oven 324 or other suitable heat source can convert the solder paste into solder connections with components 322 and/or solder balls on exposed solder pads.

To facilitate the formation of bends in structure 200, substrates 306 and 308 may be bent prior to and/or during the lamination process. In this way, relatively thick structures can be formed with bends without introducing undesirably large amounts of stress. As shown in FIG. 6, for example, substrate 306 and substrate 308 may be laminated together using compressive fixtures and solder joint formation tool 324. During lamination with tools 324, substrate 306 and 308 may be compressed together and, during compression, may be held in a bent configuration. Solder joints may be formed using a heat bar, heat gun, oven, or other source of heat within tools 324. Because substrates 306 and 308 are bent prior to lamination of substrate 306 to substrate 308, structures 200 will tend to have minimal stress due to bending. Structures 306 and 308 may be relatively thin (e.g., 100 microns or less or 200 microns or less) and can therefore be bent without introducing excessive bending stress (e.g., when compared to bending pre-laminated substrates).

After the substrates have been bent into their desired shape, the lamination process can be used to attach substrates 306 and 308 together in their bent shape. Lamination may be performed using adhesive and heat and pressure (as an example). To minimize stress, it may be desirable to slightly over-bend substrates 306 and 308 within compressive fixtures 324. Other configurations may also be used (e.g., bending substrates 306 and 308 to their desired final shape, under-bending substrates 306 and 308, etc.).

Compressive fixtures 324 may include cavities such as rectangular recesses or recess with other shapes to accommodate protruding components (e.g., components such as components 322). Solder joints can be formed between substrates 306 during the use of tools 324. For example, tools 324 may include heat bar equipment, an oven, or other heating equipment for reflowing solder 312, 314, and/or 316, thereby electrically connecting the traces in substrates 306 and 308.

Following lamination of substrates 306 and 308 using tool 324, substrates 306 and 308 have a desired bent shape and form structures 200. Structures 200 may, if desired, be attached to a support structure such as carrier 326. Carrier 326 may, for example, be formed from a dielectric such as plastic (e.g., to accommodate structures such as antenna structures, capacitive proximity sensor structures, and other structures that might potentially be affected by the presence of conductive support structures). Structures 200 may be attached to carrier 326 to form mounted structures 330 using adhesive or other suitable attachment mechanisms.

Figure 7:
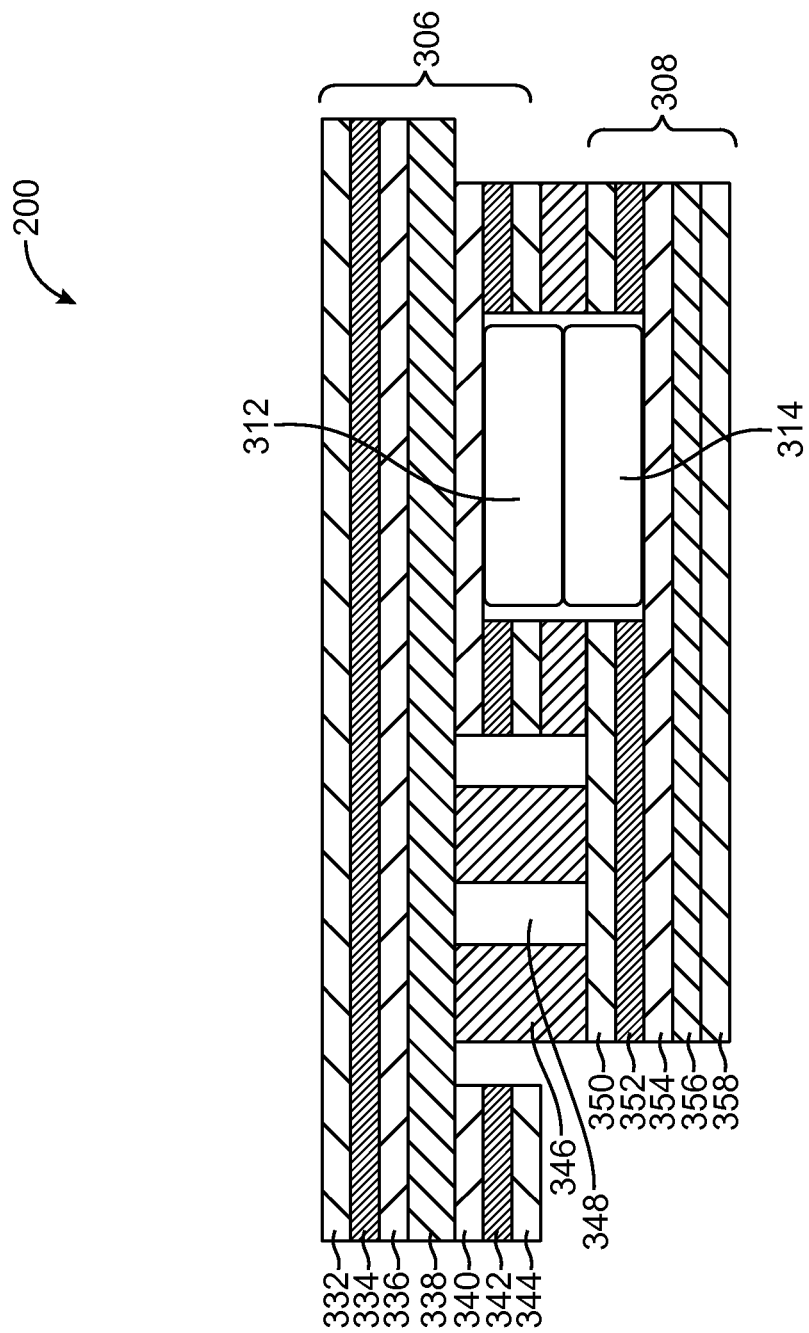
FIG. 7 is a cross-sectional side view of an illustrative electronic component formed from two flex circuit substrates that have been interconnected using patterned solder paste in accordance with an embodiment of the present invention.

An illustrative set of material layers that may be used in forming substrates such substrate layers 306 and 308 of FIG. 6 are shown in FIG. 7. As shown in FIG. 7, layer 306 may include coverlay (solder mask) layer 332, adhesive layer 334, a metal layer such as copper layer 336, a polymer layer such as polyimide layer 336, a metal layer such as copper layer 340 (which may be, if desired, shorted to layer 336 using vias through polyimide layer 338), adhesive layer 342, and coverlay layer 344. Layers 336 and 340 may, if desired, form patterned metal structures such as structures 200L of FIG. 5. Layer 308 may include coverlay layer 350, adhesive layer 352, a metal layer such as copper layer 354, a polymer layer such as polyimide layer 356, and coverlay layer 358.

As shown in FIG. 7, solder paste 312 may be patterned to mate with solder paste 314. Following reflow operations, solder paste 312 and 314 can form a solder connection between conductive structures on layers 306 and conductive structures on layer 308 (e.g., metal layers such as layers 336, 340, and 354). These connections may be used in forming signal paths for sensor signals, signal paths for antenna signals, and/or signal paths for other signals. Coverlay layers in layers 306 and 308 may serve as a solder mask. Adhesive 346 may be used to attach layers 306 and 308. Adhesive 346 may be patterned to form air gaps such as air gaps 348. Air gaps may also be formed from inspection holes within layers 306 and 308. The inspection holes may be provided in the vicinity of solder joints to help determine whether solder joints have been formed properly. The presence of the air gaps may provide exit paths that allow gas to escape from solder paste 312 and 314 when solder paste 312 and 314 is heated.

Figure 8:
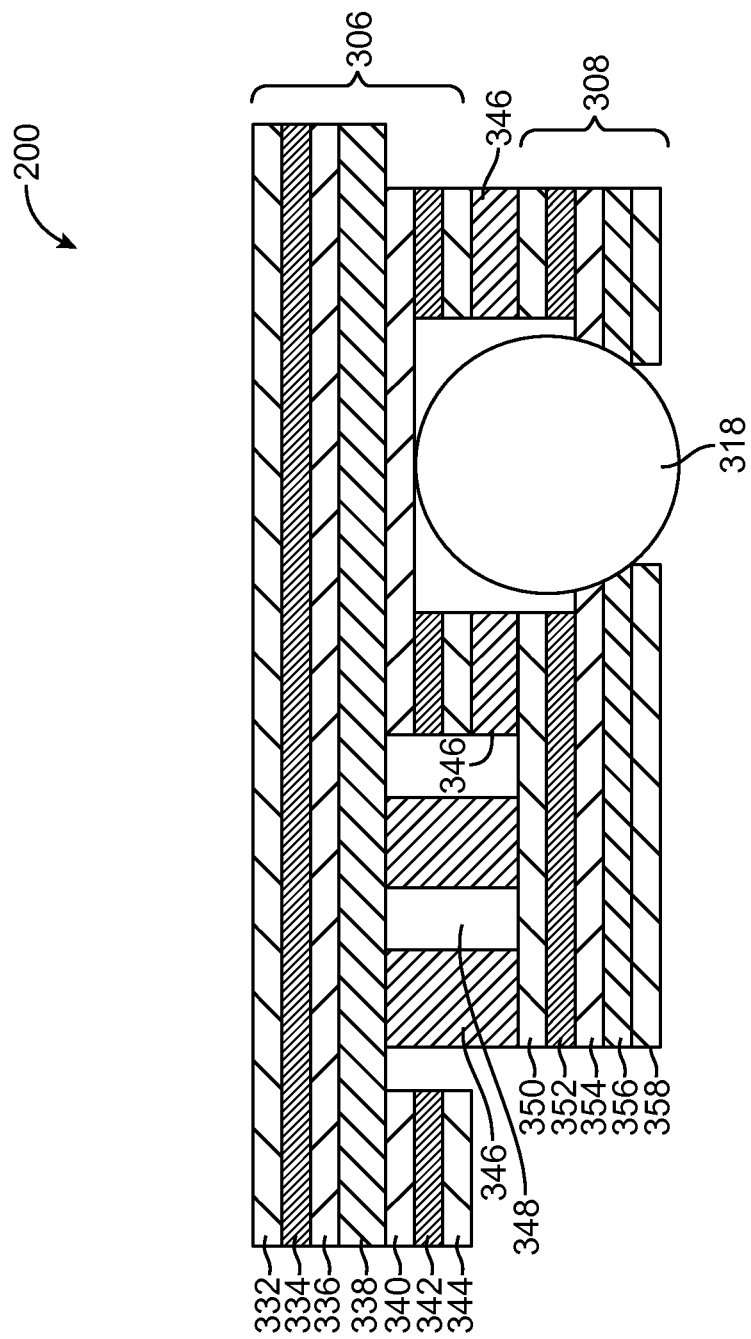
FIG. 8 is a cross-sectional side view of an illustrative electronic component formed from two flex circuits that have been interconnected using a solder ball in accordance with an embodiment of the present invention.

In the arrangement for layers 306 and 308 that is shown in FIG. 8, solder 318 has been used to form a solder connection between the conductive structures on layers 306 and 308. The thickness of each of layers 306 and 308 may be (for example) about 70-150 microns, about 40-200 microns, or other suitable thicknesses.

Figure 9:
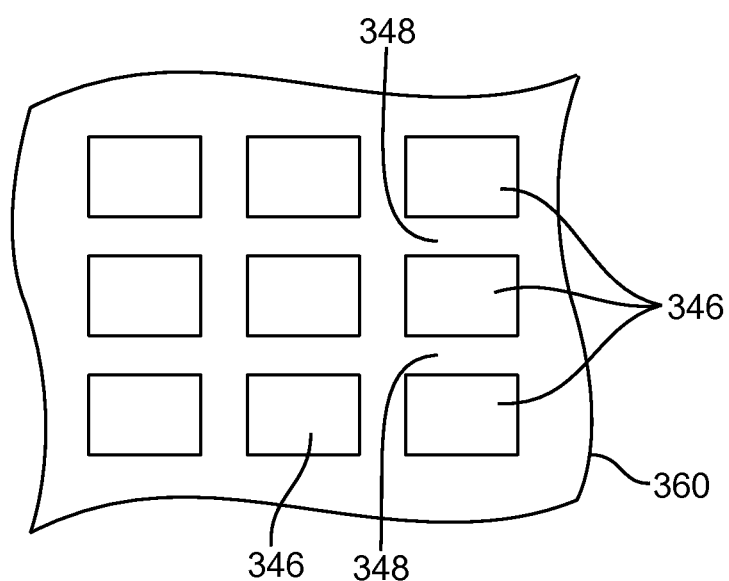
FIG. 9 is a cross-sectional top view of an illustrative adhesive pattern that may be used to provide air gap channels that accommodate escaping gas when connecting multiple flex circuit layers with solder in accordance with an embodiment of the present invention.

FIG. 9 is a top view of patterned adhesive 346 of FIG. 9 (on an illustrative substrate layer shown as layer 360). Adhesive 346 may be patterned to form rectangular islands, elongated strips, other tiled structures, or other suitable shapes that form interspersed air gap paths 348. Air gap paths 348 may serve as channels to allow gases to escape from structures 200 during solder reflow operations.

Figure 10:
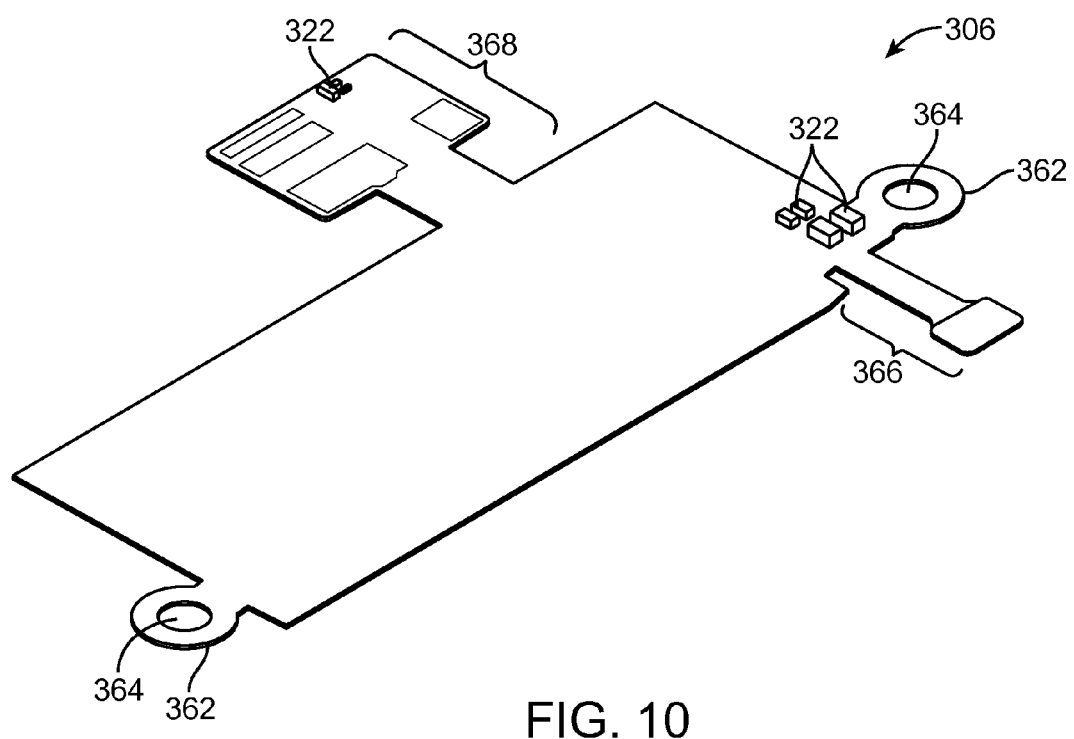
FIG. 10 is a perspective view of an illustrative flex circuit of the type that may be connected to another flex circuit to form an electronic component in accordance with an embodiment of the present invention.

FIG. 10 is a perspective view of an illustrative substrate layer such as substrate layer 306. As shown in FIG. 10, layer 306 may have alignment features such as portions 362 that form alignment holes 364. Components 322 may be mounted on one or both sides of layer 306. Tails such as tails 366 and 368 or other protruding structures may be used to interconnect the circuitry of layer 306 to other structures in device 10. For example, tails 366 and 368 may be used in forming signal paths for radio-frequency signals (e.g., transmission line paths), signal paths for sensor signals, and signal paths for other signals.

Figure 11:
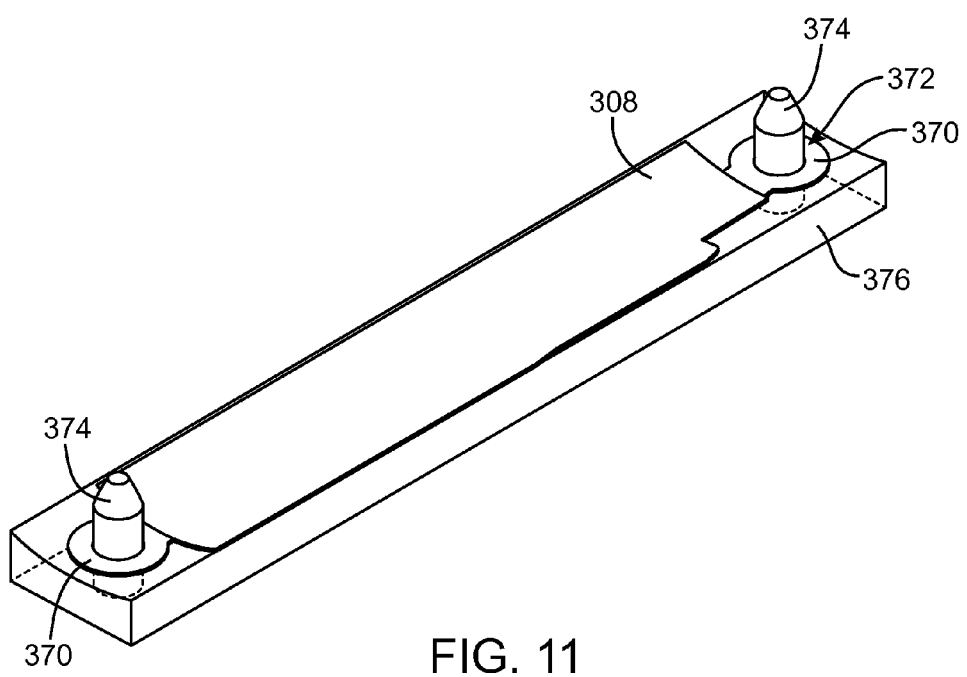
FIG. 11 is a perspective view of part of an illustrative flex circuit lamination tool and a flex circuit of the type that may be coupled to the flex circuit of FIG. 10 to form an electronic component in accordance with an embodiment of the present invention.

FIG. 11 is a perspective view of an illustrative substrate layer such as layer 308. In the configuration of FIG. 11, substrate layer 308 has been mounted on compressive fixture 376. Compressive fixture 376 may form part of a two piece compressive fixture (e.g., tool 324 of FIG. 6) that compresses and bends layers 306 and 308 during lamination. Fixture 376 may have a concave upper surface that mates with a convex lower surface of a mating compressive fixture. If desired, one of the compressive fixture structures may be formed from an elastomeric substance (e.g., silicone) and the other compressive fixture may be implemented using a rigid material (e.g., steel).

As shown in FIG. 11, layer 308 may have alignment features of the type provided in layer 306. For example, layer 308 may have portions 370 with alignment holes 372. Posts 374 of fixture 376 may protrude through holes 372. When substrate layer 306 is placed over layer 308 for lamination, holes 364 may fit over posts 374 or other tool alignment structures. By providing layers 306 and 308 with matching alignment holes or other alignment features and by providing the compressive fixtures with mating alignment posts or other mating alignment features, layers 306 and 308 may be aligned with respect to the compressive fixtures and to each other during lamination.

Figure 13:
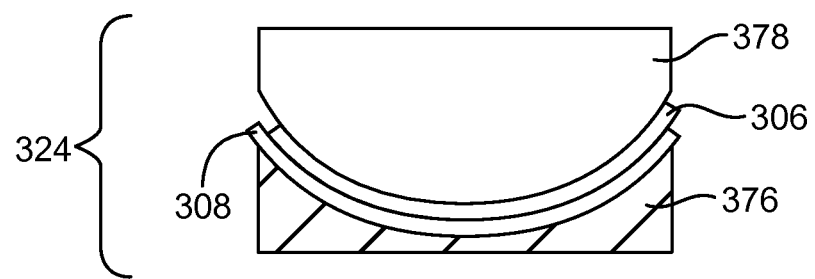
FIG. 13 is a cross-sectional side view of an illustrative tool for assembling flex circuit structures together during compression of the flex circuit structures between upper and lower tool pieces in accordance with an embodiment of the present invention.

FIGS. 12 and 13 show how layers 306 and 308 may be compressed together using compressive fixtures (tools 324). As shown in FIG. 13, layers 306 and 308 may be placed on top of each other on lower fixture 376 (e.g., using alignment features to ensure proper alignment). Fixture 376 may mate with fixture 378. An oven or other heated chamber may be used to enclose fixture 376 and fixture 378 in tools 324 and/or other heat sources may be provided in tools 324 (e.g., a heat gun, a hot bar, etc.). The oven or other heat source may be used as a solder joint formation tool (i.e., the oven may be used to heat solder to its melting point to attach the solder structures within layers 306 and 308 to each other). Fixture 378 may be formed from a rigid material such as steel. Fixture 376 may be formed from a pliable elastomeric substance such as silicone that can conform to the shape of fixture 378 when fixture 378 is pressed against fixture 376 in direction 380.

Fixture 376 may have a concave surface with a bend radius that is slightly larger than the desired bend radius for layers 306 and 308. Fixture 378 may have a convex surface with a bend radius equal to the desired bend radius for layers 306 and 308 (i.e., a bend radius slightly smaller than the desired final bend radius for the bend in structures 200). When fixture 378 is pressed against fixture 376 in direction 380, layers 306 and 308 are compressed against each other while the elastomeric material of fixture 376 allows the concave surface of fixture 376 to conform to the convex surface of fixture 378. During the compression process, layers 308 and 306 are initially compressed together at the tip of fixture 378. Following additional compression, the rest of layers 308 and 306 are compressed together. In this way, layers 306 and 308 are progressively compressed together starting at their centers and moving towards their peripheries. This progressive lateral compression arrangement helps to avoid formation of air bubbles between layers 306 and 308 during lamination.

Figure 14:
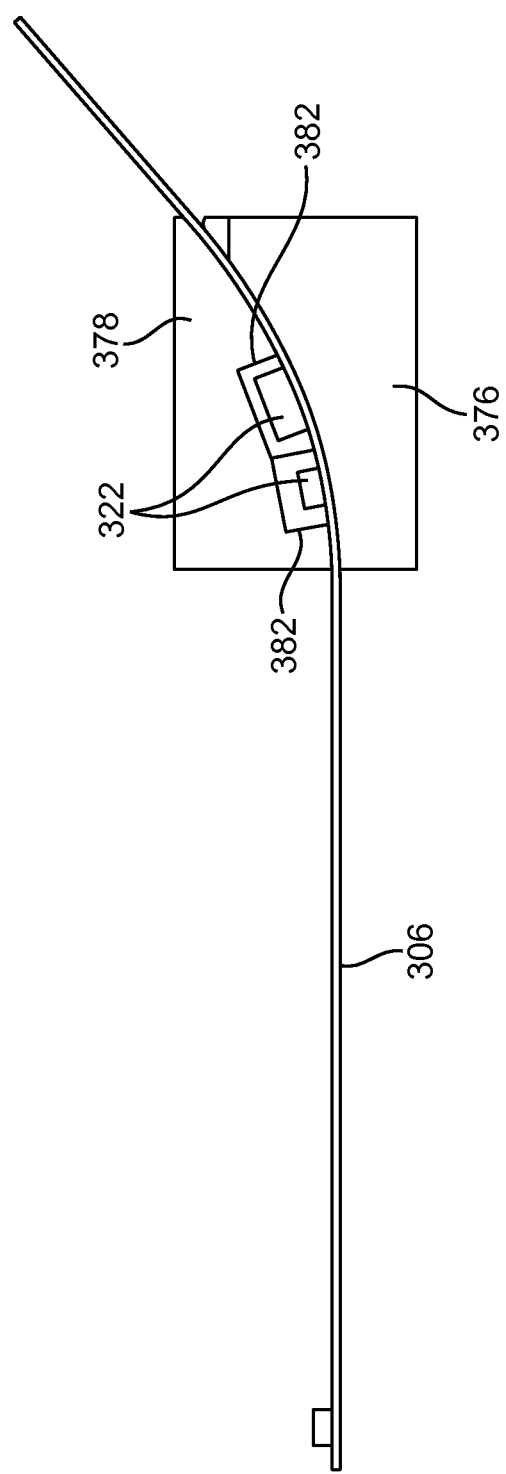
FIG. 14 is a side view of flex circuit structures of the type shown in FIGS. 10 and 11 during compression of the flex circuit structures between mating tool pieces such as rigid and elastomeric compressive fixtures in accordance with an embodiment of the present invention.

If desired, the compressive fixtures may be provided with cavities to accommodate protruding components on structures 200. As shown in FIG. 14, for example, compressive fixture 378 may be provided with cavities 382 to accommodate protruding components 322 on flex circuit layer 306. Fixture 376 may also be provided with cavities to accommodate components.

Figure 15:
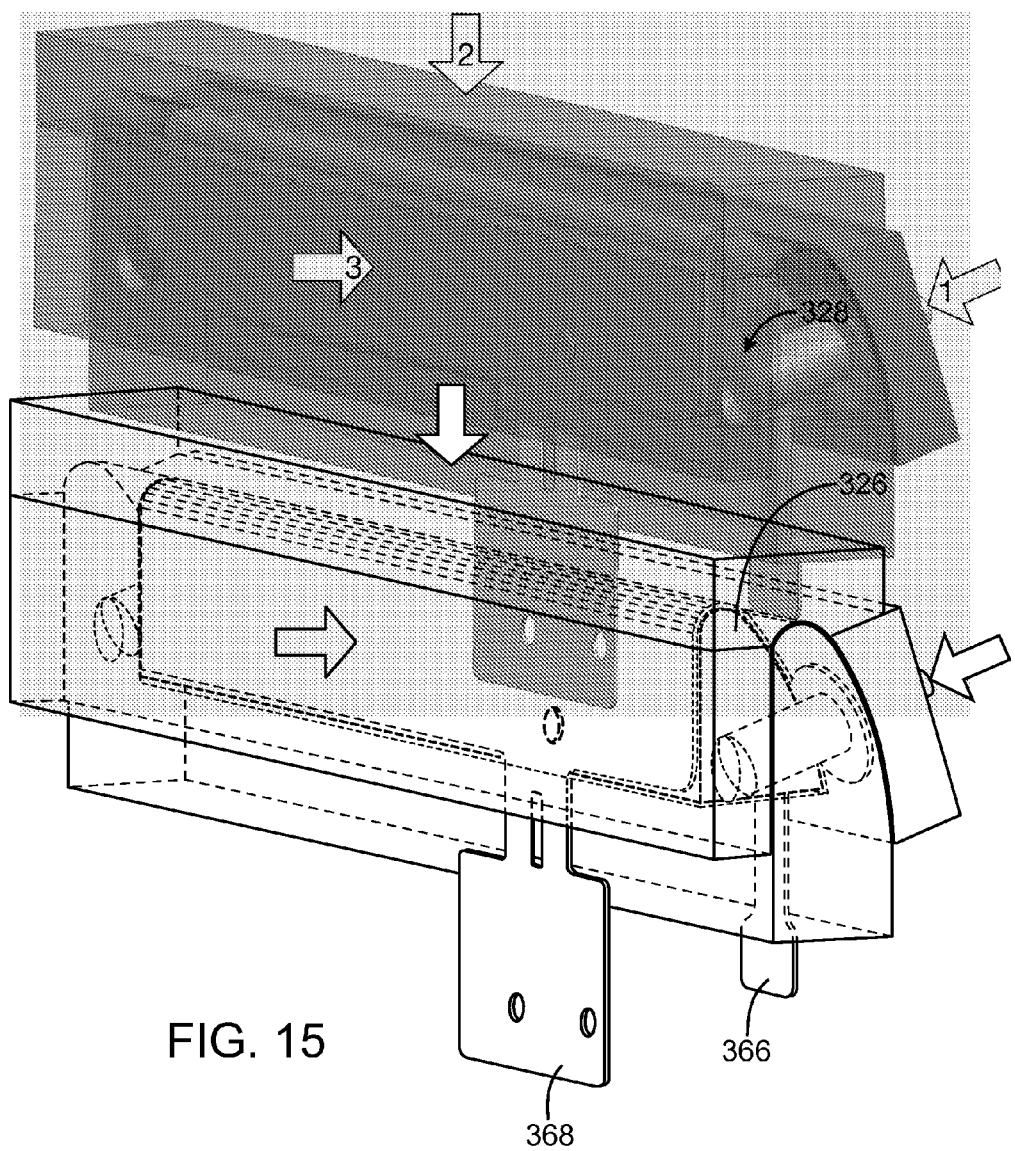
FIG. 15 is a perspective view of a tool being used to form a bend in flex circuit structures in accordance with an embodiment of the present invention.

FIG. 15 shows how tools 328 may be used to mount laminated flex circuit structures 200 to carrier 326.

The foregoing is merely illustrative of the principles of this invention and various modifications can be made by those skilled in the art without departing from the scope and spirit of the invention.

What is claimed is:
1. A flex circuit structure, comprising:
a first flex circuit layer comprising one or more conductive trace layers configured to form a first layer of patterned conductive material;
a second flex circuit layer comprising one or more conductive trace layers configured to form a second layer of patterned conductive material, wherein
the first and the second layers of patterned conductive material are laminated together, and formed on opposing sides of the flex circuit structure and at least a portion of each is electrically isolated from each other by a dielectric layer to form a parallel plate capacitor, and wherein
below a first frequency, the parallel plate capacitor has a high impedance value such that the corresponding portions of the first and second layers of patterned conductive material serve as independent first and second proximity sensor capacitor electrodes, and above a second frequency associated with a radio-frequency (RF) antenna signal, the impedance of the parallel plate capacitor is such that the first and the second layers of patterned conductive material are effectively shorted to each other to operate together as a unitary patterned conductor to act as an antenna resonating element, further wherein the first proximity sensor capacitor electrode is disposed on a first surface of the flex circuit structure and the second proximity sensor capacitor electrode is disposed on a second surface of the flex circuit structure; and an adhesive layer between the first and second layers of patterned conductive material, the adhesive layer including air paths.

2. The flex circuit structure as recited in claim 1, wherein the first frequency is about 1 MHz and wherein the second frequency is about 100 MHz.

3. The flex circuit structure as recited in claim 1 wherein at least one of the first flex circuit layer and the second flex circuit layer comprises an antenna trace.

4. The flex circuit structure as recited in claim 1, wherein the first flex circuit layer comprises at least one component connected to the first layer of patterned conductive material.

5. The flex circuit structure as recited in claim 4, wherein the at least one component connected to the first layer of patterned conductive material is electrically interconnected to the second layer of patterned conductive material using an electrical interconnect.

6. The flex circuit structure as recited in claim 1, wherein the first surface is outwardly directed and the second surface is inwardly directed.

7. The flex circuit structure as recited in claim 1, wherein the first and second patterned conductive layers of the flex circuit structures are shaped in the form of an inverted-F antenna resonating element.

8. The flex circuit structure as recited in claim 7, wherein the first and second patterned conductive layers of the flex circuit structures shaped in the form of the inverted-F antenna resonating element comprise:
    a first branch;
    a second branch to provide additional frequency resonances and/or broadened antenna bandwidth;
    a short circuit branch; and
    a feed branch.

9. The flex circuit structure as recited in claim 7, wherein the inverted-F antenna further comprises at least one additional arm, the additional arm being shaped as a bend, or as a curve.

10. The flex circuit structure as recited in claim 9, the flex circuit structure further comprising a first positive antenna feed terminal and a first ground antenna feed terminal, the first positive antenna feed terminal arranged to receive an RF signal from an RF transceiver by way of a positive signal line at a second positive antenna feed terminal coupling the first positive antenna feed terminal and the RF transceiver.

11. The flex circuit structure as recited in claim 10, the first ground antenna feed terminal coupled to a ground signal line at a second ground antenna feed terminal.

12. The flex circuit structure as recited in claim 11, wherein the second positive antenna feed terminal is coupled to the first positive antenna feed terminal via a capacitor Cfp.

13. The flex circuit structure as recited in claim 10, wherein the first positive antenna feed terminal is connected to an antenna resonating element branch.

14. The flex circuit structure as recited in claim 11, wherein the second ground antenna feed terminal is coupled to the first ground antenna feed terminal via a capacitor Cfg, wherein
    capacitors Cfg and Cfp form a high pass filter configured to prevent low frequency noise from interfering with an RF antenna operation of the flex circuit structure.

15. The flex circuit structure as recited in claim 10, wherein the RF transceiver is disposed within a housing of a portable electronic device, the housing formed of RF opaque material, the housing further comprising an opening suitably sized to accommodate an RF transparent structure.

16. The flex circuit structure as recited in claim 11, wherein the flex circuit structure is disposed within the housing in proximity to the opening.

17. The flex circuit structure as recited in claim 16, wherein the flex circuit structure conforms to an inside surface of the housing.

18. The flex circuit structure as recited in claim 17, wherein the flex circuit structure is laminated and bent to conform to the inside surface.

19. The flex circuit structure as recited in claim 1 wherein at least one of the first flex circuit layer and the second flex circuit layer is formed from sheets of polyimide.

20. The flex circuit structure as recited in claim 1 wherein the first and second flex circuit layers are soldered to each other.

* * * * *